United States Patent [19]
Johnson

[11] 4,214,292
[45] Jul. 22, 1980

[54] PRINTED CIRCUIT BOARD GUIDE SPRING

[75] Inventor: Gary R. Johnson, Eagan, Minn.

[73] Assignee: Sperry Corporation, New York, N.Y.

[21] Appl. No.: 964,991

[22] Filed: Nov. 30, 1978

[51] Int. Cl.² ............................................. H05K 7/20
[52] U.S. Cl. .................................. 361/386; 361/415; 267/158; 211/41
[58] Field of Search ................. 294/33; 361/386, 387, 361/399, 415; 267/158, 160, 163, 164; 339/65, 66, 176 MP, 17 LM, 17 M, 217 S; 211/41, 50; 312/341 NR; 174/16 HS, 53, 54, 58

[56] References Cited

U.S. PATENT DOCUMENTS

| 3,388,885 | 6/1968 | Holmes | 174/58 |
| 3,631,325 | 12/1971 | Wenz | 361/386 |
| 3,659,037 | 4/1972 | McDonald | 174/58 |
| 3,864,001 | 2/1975 | Millet | 339/217 F |
| 3,950,068 | 4/1976 | Schmiez | 339/217 S |
| 4,022,326 | 5/1977 | Marconi | 339/17 N |
| 4,063,660 | 12/1977 | Ware | 174/58 |
| 4,096,547 | 6/1978 | Callabro | 361/399 |

OTHER PUBLICATIONS

Calmark Publication, Electronic Packaging Products, Walnut Grove Ave., San Gabriel, Cal., Catalog C8 9/76, pp. 2-16.

*Primary Examiner*—Gerald P. Tolin
*Attorney, Agent, or Firm*—Kenneth T. Grace; William E. Cleaver; Marshall M. Truex

[57] ABSTRACT

A printed circuit board guide spring having spring members for securing the printed circuit board and the guide spring within guide slots in a heat sink.

4 Claims, 11 Drawing Figures

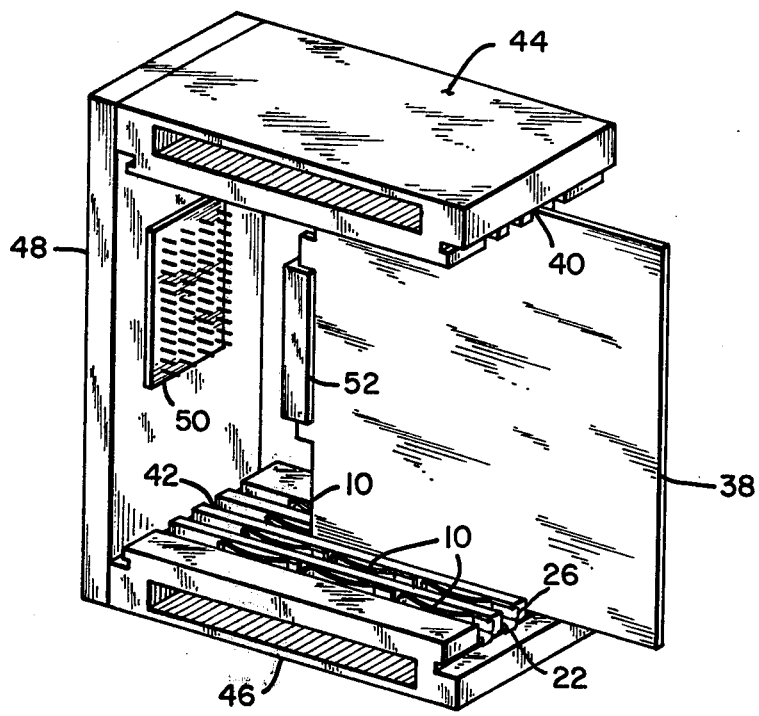
_Fig. 4_
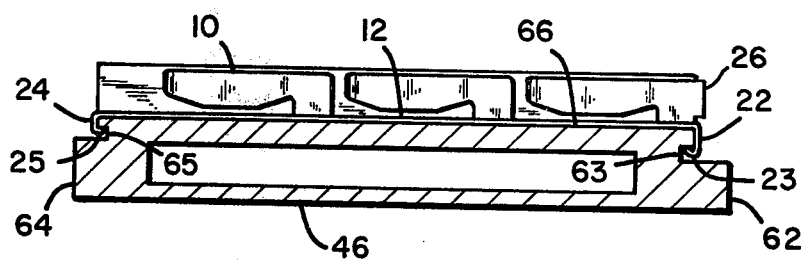
_Fig. 5_

PRINTED CIRCUIT BOARD GUIDE SPRING

BACKGROUND OF THE INVENTION

The present invention relates to the electronic packaging art and in particular to means for compressively restraining printed circuit boards while in operative condition yet permitting sliding assembly and disassembly without the need for attaching hardware. Prior art arrangements—see the J. Custer U.S. Pat No. 3,193,316—have included opposing parallel side members having opposing grooves or slots that function as a printed circuit board guide during insertion and removal of the printed circuit board into and from a printed circuit board electrical connector that is mounted in a base member orthogonally attached to the side members. Such grooves have, of necessity, loosely restrained the printed circuit board for ease of insertion and removal.

At the present time, because of the packaging of MSI, LSI, VLSI electronic components on printed circuit boards and their high power consumption per unit volume, there is a corresponding requirement for inproved heat dissipation within supporting electronic modules. In the C. Wenz U.S. Pat. No. 3,631,325 the electronic component supporting printed circuit boards are mounted between opposing parallel heat sinks by inserting the printed circuit board in a pair of supporting slots in the opposing parallel surfaces of the supporting heat sinks. The parallel, structurally supporting edges of the printed circuit board are placed in intimate contact with one side wall of each of the supporting slots for conducting the electronically generated heat away from the printed circuit board mounted electronic components and into the heat sink for dissipation therein. In the Wenz configuration, a plurality of spring members are affixed to the slot side wall, as by an adhesive. However, experience with such design has indicated that the use of such spring members and their method of affixation are economically unfeasible for high quantity production. A hardware mounted printed circuit board guide spring member, such as that of Series 165 Retainer, Calmark, Corp., 4947 Walnut Grove Avenue, San Gabriel, Calif., 91776, has been considered; however, the relatively high costs of assembly, in mounting hardware and labor, requires that a more simplified design be obtained. This same cost obstacle is applicable to the use of a wedge clamp—see the publication "Increasing the Power of Dissipation of PC Cards—a New Look at the Design Constraints," K. Garcia, Wescon Technical Papers, 1975, Pages 1-7.

SUMMARY OF THE INVENTION

In the printed circuit board guide spring of the present invention, the problems inherent in known devices are overcome in an economical, reliable design. The guide spring of the present invention is proportioned to fit within the printed circuit board supporting slot of the heat sink without the need for any additional means of affixation thereto. The guide spring has a rectangular base member along one side of which are formed a plurality of printed circuit board retaining spring members and along the two ends of which tabs are formed into spring-like flange members for compressively clipping into associated indentations in the heat sink that are oriented along the ends of the supporting slot. The two end associated flange members removably secure the guide spring within the supporting slot while an additional tab, associated with one of the end associated spring members, acts as a guide for ensuring smooth, catch-free end insertion of the printed circuit board into the supporting slot and along the spring members. The spring members compressively maintain intimate contact of the printed circuit board with the heat sink for efficient heat transfer therebetween.

BRIEF DESCRIPTION OF THE DRAWINGS

FIG. 4 is an isometric view of a portion of a supporting electronic module in which the guide spring of FIGS. 1, 2 and 3 is incorporated.

FIG. 5 is a cross-sectional view of the heat sink of FIG. 4 showing, in greater detail, the installation of the guide spring.

DESCRIPTION OF THE PREFERRED EMBODIMENT

Figure 2:
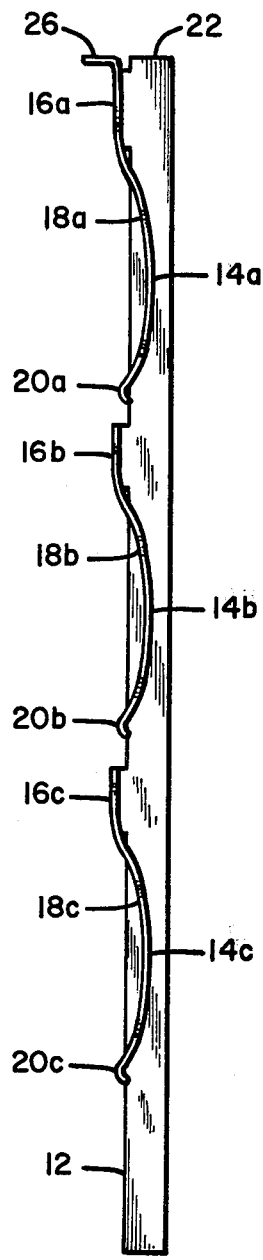
FIGS. 1, 2 and 3 are orthographic projections of the printed circuit board guide spring of the present invention.
Figure 1:
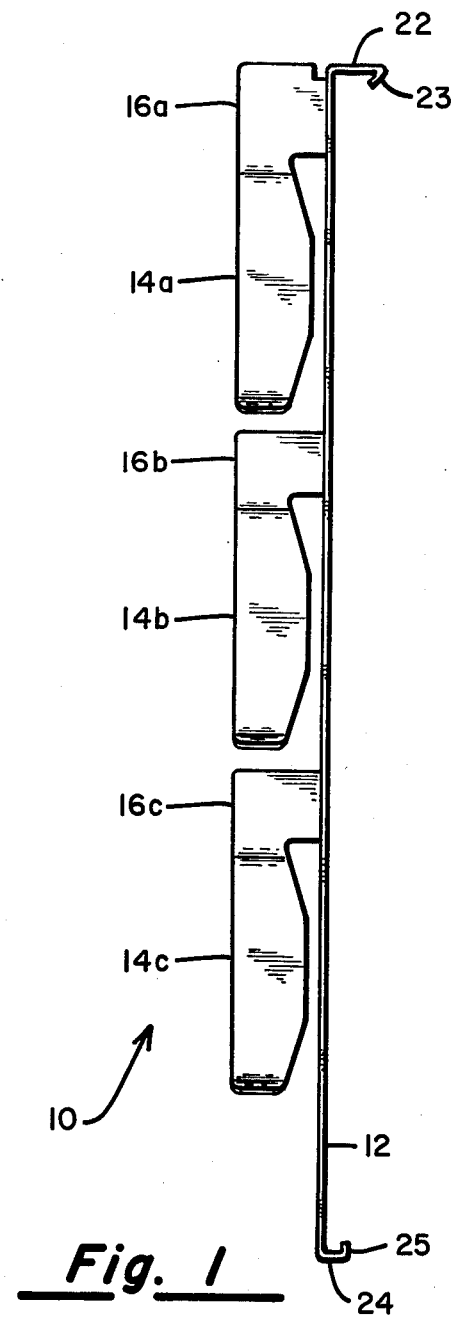
Figure 3:
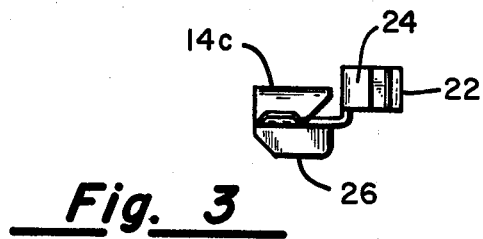
Figure 1A:
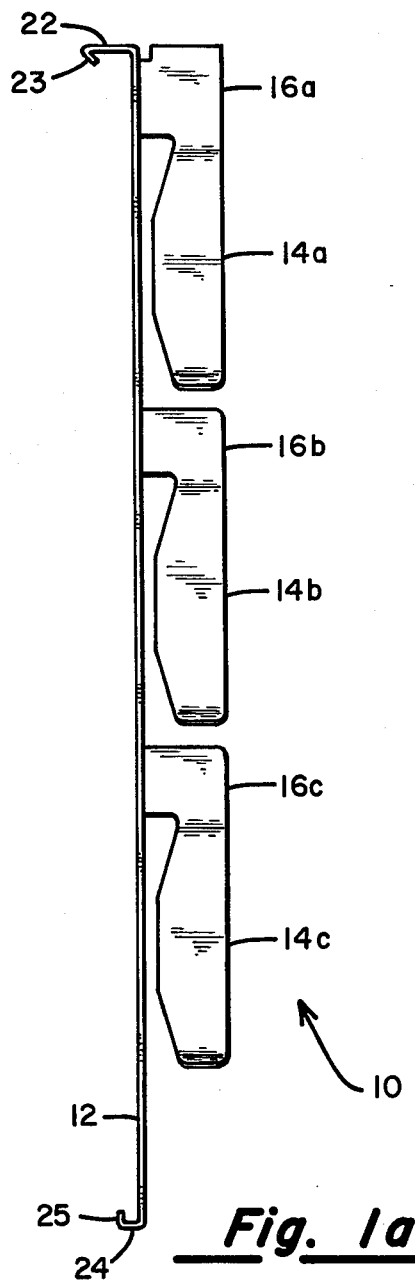
FIGS. 1a, 2a and 3a are orthographic projections of the mirror image of the printed circuit guide spring of FIGS. 1, 2 and 3.
Figure 2A:
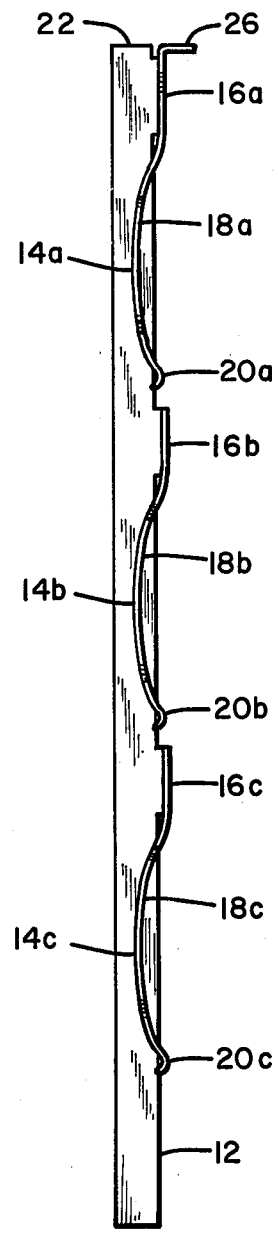
Figure 3A:
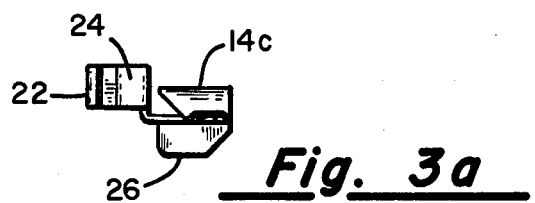

With particular reference to FIGS. 1, 2 and 3, there are presented orthographic projections of the printed circuit board guide spring of the present invention—FIGS. 1a, 2a and 3a are orthographic projections of the mirror image of the printed circuit board guide spring of FIGS. 1, 2 and 3. Guide spring 10 consists of a rectangular planar base member 12 having a plurality of spring-like members 14a, 14b, 14c formed integrally with the base member 12 along one side thereof and at a right angle thereto in a first direction therefrom. Each of the members 14 includes a flange 16 that is formed from the sheet stock from which guide spring 10 is formed by bending upwardly at a right angle and along a bend line that is along one long side of base member 12. Each of the members 14 includes an arcuate portion 18 that extends longitudinally, along the length of the guide spring 10, terminating in an upturned flange 20. Guide spring 10, at opposite ends of the base member 12, has first and second flange members 22, 24 that are formed integrally with base member 10 and along the opposite ends thereof and at a right angle thereto in a like second direction, opposite to the first direction along which flanges 16 of members 14 are formed.

Each of the flange members 22 and 24 have associated first and second tab members 23 and 25, respectively, that are formed integrally with tabs 22 and 24 and that are formed integrally therewith and in generally toward directions. Tab 25 of flange 24 is formed at a right angle to flange 24 to be parallel to base member 12 while tab 23 of flange 22 is formed at an obtuse angle thereto forming a 45° angle with both flange 22 and base member 12. Lastly, flange 16a of the first, end member 14a has a flange member 26 formed integrally therewith at a right angle with respect to flange 16 to be in the same plane as that of flange 22.

As will be discussed in greater detail hereinbelow, flanges 22 and 24 cooperate with indentations in a supporting heat sink wherein flanges 22 and 24 function as spring-like clips which under compression from the associated heat sink and the cooperating indentations therein function to secure guide spring 10 in the associated slot. Additionally, flange 26, along with flange 22, functions as a guide for ensuring a smooth insertion of the associated printed circuit board when inserted within the slot in which the guide spring 10 is secured by flanges 22 and 24.

Guide spring 10 consists of a single piece of sheet stock of 0.008 inch thick sheet of a spring material such as beryllium-copper which is hardened to a diamond penetration hardness of 338 min at a 500 gram load. The spring members, flanges and tabs are preferably punched into planar shape and then formed by any of well-known means such as the use of a hydraulic press because guide spring 10 is intended to be a very high quantity production item. The illustrated, preferred embodiment of spring guide 10 is believed to be of a design that requires the minimum number of manufacturing operations while when installed in its operative position requires no attaching hardware other than the flange members 22 and 24. Further, it will be appreciated that mirror-image designs of guide spring 10 will be required for two-sided applications such as illustrated in FIG. 4—see guide spring 10a of FIGS. 1a, 2a and 3a.

With particular reference to FIG. 4, there is presented an isometric view of a portion of a supporting electronic module in which the guide spring of FIGS. 1, 2 and 3—and of FIGS. 1a, 2a and 3a—is incorporated. In this illustrated application of a plurality of guide springs 10, a plurality of printed circuit boards 38 are each supported by a pair of opposing supporting slots 40, 42 within side wall members 44, 46, respectively, for supportingly guiding the printed circuit board 38 toward end wall 48 upon which there are affixed a plurality of electrical male connectors or pins 50. When printed circuit board 38 is aligned with the corresponding opposing pair of supporting slots 40, 42, is inserted therein and is moved therealong toward end wall 48, an electrical female connector or receptacle 52, affixed thereto, is guided toward and makes electrical connection with the mating electrical male connectors or pins 50 on back wall 48. When printed circuit board 38, with its associated electronic components, is fully inserted into its corresponding opposing pair of slots 40, 42 and pins 50 and receptable 52 are in their coupled condition, the members 14 of the associated guide spring 10 provide a sufficient compressive grip upon the associated printed circuit board 38 to ensure the secure installation of printed circuit board 38 and its desired electrical connection between pins 50 and receptacle 52 while also maintaining the opposite surface of the side portion of printed circuit board 38 in intimate contact with the supporting side wall of the associated supporting slot 40, 42. This intimate contact of the surface of printed circuit board 38 and the supporting side wall of the supporting slots 40 and 42 ensure an efficient heat transfer between the electronic components mounted upon printed circuit board 38 and the heat sinks formed by side wall members 44 and 46.

With particular reference to FIG. 5 there is presented a cross-sectional view of the heat sink of FIG. 4 showing, in greater detail, the installation of the guide spring 10. FIG. 5 illustrates that when the tabs 23, 25 of the associated flanges 22, 24 are secured within their associated indentations or grooves 63, 65 of the respective end walls 62, 64 of the end wall 46, the end flanges 22, 24 secure guide spring 10 in its longitudinal position within the associated slot 42 while base member 12 is compressively in an intimate contact with the bottom surface 66 of the associated slot 42.

Figure 6:
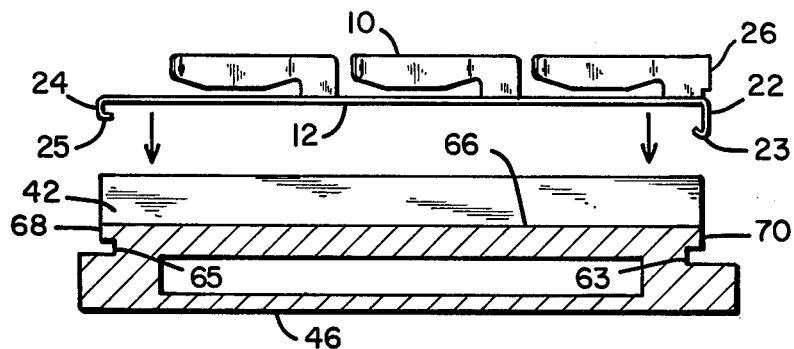
FIGS. 6, 7 and 8 are illustrations of a method of assembling the guide spring to the heat sink and within a supporting slot.
Figure 7:
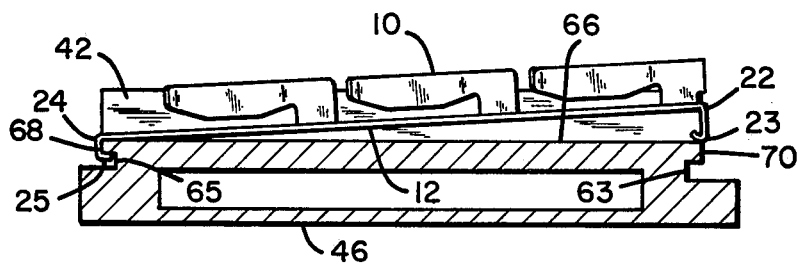
Figure 8:
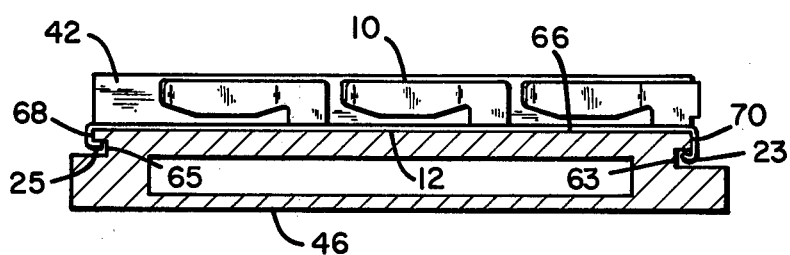

With particular reference to FIGS. 6, 7 and 8, there are presented illustrations of a method of assembling spring guide 10 within a supporting slot 42 of the heat sink forming side wall member 46. Initially, guide spring 10 is aligned with the corresponding slot 42, as in FIG. 6, to be brought within the confines of the side walls thereof. Next, as in FIG. 7, guide spring 10 has its flange 24 slipped over ridge 68 of heat sink 46 whereby flange 25 snaps into indentation 65 of heat sink 46. At this time tab 23 of flange 22 is brought into contact with ridge 70 of heat sink 46 preparatory to being compressively extended thereover whereby flange 22 is springingly extended permitting tab 23 to slip over ridge 70 and into the corresponding indentation 63 of heat sink 46. FIG. 8 illustrates the condition when guide spring 10 is fully installed within the corresponding slot 42 wherein flanges 22 and 24 overlap ridges 70 and 68, respectively, with the corresponding tabs 23 and 25 compressively secured within their corresponding indentations 63 and 65 while the bottom surface of base member 12 is in intimate contact with the bottom surface 66 of slot 42. When it is required that spring guide 10 is to be removed from its corresponding slot 42, tab 23 and flange 22 may be lifted away from the corresponding indentation 63 and ridge 70 releasing guide spring 10 therefrom.

It can be seen that the guide spring of the present invention provides a novel means whereby a guide spring may be secured within its corresponding supporting slot of a supporting member without the need for additional attaching means such as hardware or adhesive while compressively maintaining intimate contact of the associated printed circuit board with the heat sink for efficient heat transfer therebetween.

What is claimed is:

1. A guide spring, comprising:
  a rectangular planar base member;
  a plurality of spring-like members formed integrally with said base member along one side thereof and at a right angle thereto in a like first direction therefrom;
  first and second flange members formed integrally with said base member along the opposite ends thereof and at a right angle thereto in a like second direction, opposite to said first direction, therefrom;
  said first and second flange members having first and second tab members, respectively, formed integrally therewith in an opposing direction, and extending generally toward each other; and,
  a third flange member formed integrally with an end one of said spring-like members and in the same plane as said first flange member.

2. The guide spring of claim 1, wherein:
  said first spring-like flange member first tab member is formed integrally therewith at a 45° angle thereto and toward said second spring-like flange member; and,
  said second spring-like flange member second tab member is formed integrally therewith at a right angle thereto and toward said first flange member.

3. In an electronic packaging scheme in which a plurality of heat generating electronic components are mounted on each of a plurality of printed circuit boards that are, in turn, supportively mounted in a pair of supporting slots in opposing parallel faces of two heat sinks, a guide spring for compressively securing each side of each of said printed circuit boards within its associated slot and against one side wall thereof, comprising:

- planar base member means that generally conforms to the width of said supporting slot;
- a plurality of spring-like member means formed integrally from said base member means along one side thereof and at an angle thereto in a like first direction therefrom for compressively mating with a first side wall of said supporting slot;
- first and second flange member means formed integrally from said base member means along the opposite ends thereof and at an angle thereto in a like second direction, generally opposite to said first direction, therefrom for compressively mating with the ends of said supporting slot; and,
- third flange member means formed integrally from an end one of said spring-like member means and in the same plane as said first flange member means for mating with the same end of said supporting slot as does said first flange member means.

4. In an electronic packaging scheme in which a plurality of printed circuit boards are supportively mounted in a pair of supporting slots in opposing parallel faces of supporting side wall members, a guide spring for compressively securing at least one side of each of said printed circuit boards within its associated slot and against one side wall thereof, comprising:

- rectangular planar base member means that generally conforms to the length and width of said supporting slot;
- a plurality of spring-like member means formed integrally from said base member means along one side thereof and at a right angle thereto in a like first direction therefrom for compressively mating with a first side wall of said supporting slot;
- first and second flange member means formed integrally from said base member means along the opposite ends thereof and at an angle thereto in a like second direction, generally opposite to said first direction;
- said first and second flange member means having first and second tab member means, respectively, formed integrally therefrom in an opposing direction, and extending generally toward each other for compressively mating with indentations in said supporting side wall member and compressively securing said guide spring in said supporting slot; and,
- third flange member means formed integrally with an end one of said spring-like member means and in the same plane as said first flange member means.

* * * * *